(12) United States Patent
Briggs et al.

(10) Patent No.: US 10,901,317 B2
(45) Date of Patent: Jan. 26, 2021

(54) EXTREME ULTRAVIOLET (EUV) LITHOGRAPHY PATTERNING METHODS UTILIZING EUV RESIST HARDENING

(71) Applicant: International Business Machines Corporation, Armonk, NY (US)

(72) Inventors: Benjamin D. Briggs, Waterford, NY (US); Michael Rizzolo, Albany, NY (US); Ekmini Anuja De Silva, Slingerlands, NY (US); Chih-Chao Yang, Glenmont, NY (US); Lawrence A. Clevenger, Rhinebeck, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 16/553,854

(22) Filed: Aug. 28, 2019

(65) Prior Publication Data

US 2019/0384180 A1      Dec. 19, 2019

Related U.S. Application Data

(62) Division of application No. 15/852,377, filed on Dec. 22, 2017, now abandoned.

(51) Int. Cl.
*G03F 7/09*      (2006.01)
*H01L 21/3213*   (2006.01)
(Continued)

(52) U.S. Cl.
CPC .............. *G03F 7/094* (2013.01); *G03F 7/091* (2013.01); *G03F 7/405* (2013.01);
(Continued)

(58) Field of Classification Search
CPC ................................. G03F 7/091; G03F 7/094
See application file for complete search history.

(56) References Cited

U.S. PATENT DOCUMENTS

| | | |
|---|---|---|
| 5,212,046 A | 5/1993 | Lamola et al. |
| 5,387,529 A | 2/1995 | Oku |

(Continued)

OTHER PUBLICATIONS

Y.-C. Tseng et al., "Enhanced Lithographic Imaging Layer Meets Semiconductor Manufacturing Specification a Decade Early," Advanced Materials, May 15, 2012, pp. 2608-2613, vol. 24, No. 19.

(Continued)

*Primary Examiner* — Kathleen Duda
(74) *Attorney, Agent, or Firm* — Abdy Raissinia; Ryan, Mason & Lewis, LLP

(57) ABSTRACT

Extreme ultraviolet (EUV) lithographic patterning methods are provided which implement a surface-hardened EUV resist mask to pattern features in multiple layers. A layer of EUV resist material is formed on a substrate. An EUV resist mask is formed by exposing and developing the layer of EUV resist material. A surface-hardened EUV resist mask is formed by applying a surface treatment to an upper surface of the EUV resist mask to form an etch-resistant layer that is embedded in the upper surface of the EUV resist mask. At least one layer of the substrate is patterned using the surface-hardened EUV resist mask. The surface treatment can be implemented using a neutral atom beam (NAB) process which is configured to implant a chemical or metallic species into the upper surface of the EUV resist mask to form the etch-resistant layer.

18 Claims, 7 Drawing Sheets

(51) Int. Cl.

| | | |
|---|---|---|
| *H01L 21/027* | (2006.01) | |
| *H01L 21/033* | (2006.01) | |
| *G03F 7/20* | (2006.01) | |
| *H01L 21/266* | (2006.01) | |
| *H01L 21/306* | (2006.01) | |
| *G03F 7/40* | (2006.01) | |

(52) U.S. Cl.
CPC ...... *G03F 7/70533* (2013.01); *H01L 21/0273* (2013.01); *H01L 21/0337* (2013.01); *H01L 21/266* (2013.01); *H01L 21/30604* (2013.01); *H01L 21/32139* (2013.01)

(56) References Cited

U.S. PATENT DOCUMENTS

| | | |
|---|---|---|
| 5,468,955 A | 11/1995 | Chen et al. |
| 6,121,158 A | 9/2000 | Benchikha et al. |
| 6,716,571 B2 | 4/2004 | Gabriel et al. |
| 7,767,985 B2 | 8/2010 | Okoroanyanwu et al. |
| 8,343,371 B2 | 1/2013 | Funk et al. |
| 8,912,097 B2 | 12/2014 | Martin et al. |
| 9,354,510 B2 | 5/2016 | Yu et al. |
| 9,613,813 B2 | 4/2017 | Sherman et al. |
| 2006/0043536 A1 | 3/2006 | Co et al. |
| 2010/0068656 A1 | 3/2010 | Yeh et al. |
| 2011/0059407 A1 | 3/2011 | Lin et al. |
| 2012/0058428 A1 | 3/2012 | Hatekeyama et al. |
| 2016/0181100 A1 | 6/2016 | DeVilliers et al. |

OTHER PUBLICATIONS

List of IBM Patents or Patent Applications Treated as Related.

EXTREME ULTRAVIOLET (EUV) LITHOGRAPHY PATTERNING METHODS UTILIZING EUV RESIST HARDENING

TECHNICAL FIELD

This disclosure generally relates to semiconductor fabrication techniques and, more specifically, to EUV lithographic patterning methods for use in fabricating semiconductor integrated circuits.

BACKGROUND

Various types of multi-patterning photolithography techniques can be utilized to manufacture semiconductor integrated circuits. Such multi-patterning techniques include sidewall image transfer (SIT), self-aligned doubled patterning (SADP), and self-aligned quadruple patterning (SAQP) techniques, for example. The current SIT, SADP and SAQP methods utilize deposition and etch back processes to create uniform memorization and transfer elements. In particular, these techniques involve spacer patterning steps in which spacers are formed on the sidewalls of sacrificial features (e.g., sacrificial mandrels), wherein the sacrificial features are removed to leave a pattern of spacers which is used to etch features into an underlying layer at sub-lithographic dimensions.

For next generation technology nodes, e.g., 10 nm and beyond, these multi-patterning methods will become costlier and more complex because of the need to fabricate and utilize multiple levels of masks (e.g., mandrel mask, block masks, cut masks, etc.) to perform such methods. The use of multiple masks adds considerable design complexity and unwanted process variations due to limitations in mask fabrication technologies. In this regard, the semiconductor industry is considering next-generation EUV lithography technologies to replace or augment such multi-patterning methods. The EUV lithography with exposure wavelengths below 40 nm would allow the semiconductor industry to print features beyond the diffraction limit of the current 193 nm lithography (ArF radiation wavelength). However, EUV lithographic patterning methods require the use of relatively thin EUV resist masks for patterning sub-36 nm pitch features to prevent resist "flop-over." Moreover, EUV resist masks undergo more surface etching (resulting in reduction of mask thickness) as compared to ArF resist mask during drying etch processes such as reactive ion etching (RIE).

SUMMARY

Embodiments of the invention include EUV lithographic patterning methods which implement a surface-hardened EUV resist mask to pattern features in multiple layers. In one embodiment, an EUV lithographic patterning method comprises: forming a layer of EUV resist material on a substrate; forming an EUV resist mask by exposing and developing the layer of EUV resist material; forming a surface-hardened EUV resist mask by applying a surface treatment to an upper surface of the EUV resist mask to form an etch-resistant layer that is embedded in the upper surface of the EUV resist mask; and patterning at least one layer of the substrate using the surface-hardened EUV resist mask. In one embodiment, the surface treatment applied to the upper surface of the EUV resist mask to form the etch-resistant layer comprises a neutral atom beam (NAB) process which is configured to implant a chemical species or a metallic species into the upper surface of the EUV resist mask to form the etch-resistant layer.

Another embodiment of the invention includes a semiconductor structure which comprises: a substrate; and a multi-layer stack disposed on the substrate. The multilayer stack comprises a surface-hardened EUV resist mask formed over one or more additional layers of the multi-layer stack. The surface-hardened EUV resist mask comprises an etch-resistant layer that is embedded in the upper surface of the EUV resist mask, wherein the etch-resistant layer comprises an implanted species that is configured to chemically alter and/or structurally alter the EUV resist material to increase an etch-resistivity of the upper surface of the EUV resist mask. The implanted species comprises a chemical species or a metallic species which is implanted into the upper surface of the EUV resist mask using a NAB process.

Other embodiments will be described in the following detailed description of embodiments, which is to be read in conjunction with the accompanying figures.

BRIEF DESCRIPTION OF THE DRAWINGS

FIGS. 1 through 5 schematically illustrate an EUV lithographic patterning method which implements a surface hardened EUV resist mask to pattern features in multiple layers, according to an embodiment of the invention, wherein:

FIG. 1 is a schematic cross-sectional side view of a semiconductor device at an intermediate stage of fabrication, which comprises a layer of EUV resist material formed on a hard mask layer on a surface of the semiconductor device;

FIG. 2 is schematic cross-sectional side view of the semiconductor device of FIG. 1 after exposing and developing the layer of EUV resist material to form an EUV resist mask;

FIG. 3 is a schematic cross-sectional side view of the semiconductor device of FIG. 2, which shows a controlled surface treatment being applied to harden a surface of the EUV resist mask;

FIG. 4 is a schematic cross-sectional side view of the semiconductor device of FIG. 3, after patterning the underlying hard mask layer using the surface-hardened EUV resist mask; and FIG. 5 is a schematic cross-sectional side view of the semiconductor device of FIG. 4, after patterning an underlying organic planarizing layer using the surface-hardened EUV resist mask.

FIGS. 6 and 7 schematically illustrate an EUV lithographic patterning method which implements a surface hardened EUV resist mask to pattern features in multiple layers, according to another embodiment of the invention, wherein:

FIG. 6 is a schematic cross-sectional side view of a semiconductor device at an intermediate stage of fabrication, which comprises a layer of EUV resist material formed on an adhesion layer, which is formed on a hard mask that is formed on a surface of the semiconductor device; and FIG. 7 is a schematic cross-sectional side view of the semiconductor device of FIG. 6 after exposing and developing the layer of EUV resist material to form an EUV resist mask, and applying a controlled surface treatment to harden a surface of the EUV resist mask.

DETAILED DESCRIPTION

Figure 1:
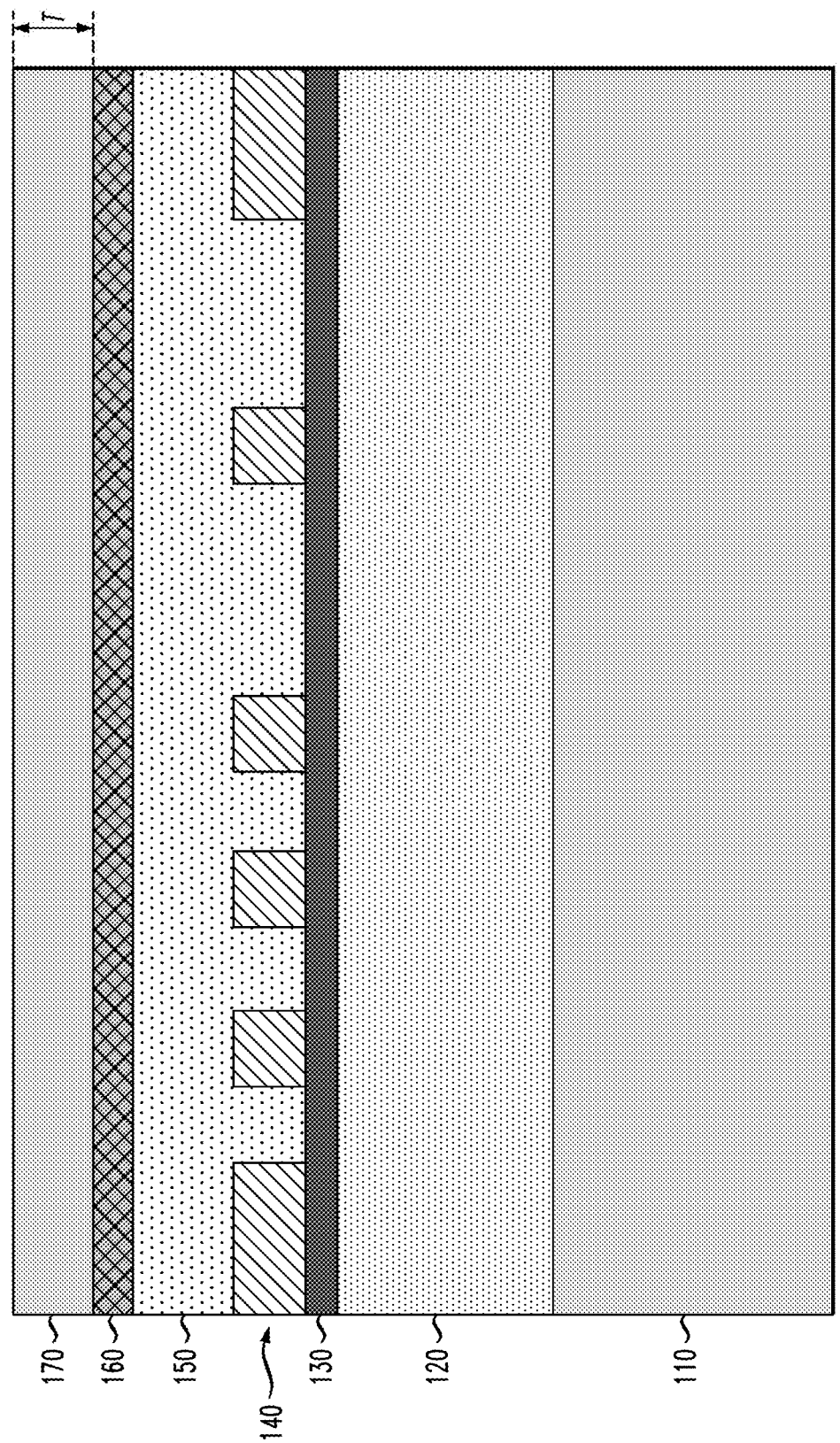

Embodiments of the invention will now be described in further detail with regard to EUV lithographic patterning methods which implement a surface-hardened EUV resist mask to pattern features in multiple layers. As explained in further detail below, embodiments of the invention include methods to enhance the etch resistance of EUV resist masks post development by utilizing a low energy, controlled surface treatment to implant metallic or chemical species within an upper surface of the EUV resist mask to form an embedded etch-resistance layer in the upper surface of the EUV resist mask. The exemplary EUV patterning methods discussed herein can be implemented for next generation technology nodes, e.g., 7 nm and beyond for patterning nano-features with pitches of 36 nm and below. In particular, the exemplary EUV patterning methods discussed herein can be implemented for patterning features in front-end-of-line (FEOL) layers, middle-of-line (MOL) layers, and back-end-of-line (BEOL) layers. For illustrative purposes, EUV patterning methods according to embodiments of the invention will be discussed in the context BEOL process modules for patterning via holes and metal line trenches in dielectric layers with pitches of, e.g., 36 nm and below.

It is to be understood that the various layers, structures, and regions shown in the accompanying drawings are schematic illustrations that are not drawn to scale. In addition, for ease of explanation, one or more layers, structures, and regions of a type commonly used to form semiconductor devices or structures may not be explicitly shown in a given drawing. This does not imply that any layers, structures, and regions not explicitly shown are omitted from the actual semiconductor structures. It is to be further understood that references herein to formation of one layer or structure "on" or "over" another layer or structure are intended to be broadly construed, and should not be interpreted as precluding the presence of one or more intervening layers or structures.

Furthermore, it is to be understood that the embodiments discussed herein are not limited to the particular materials, features, and processing steps shown and described herein. In particular, with respect to semiconductor processing steps, it is to be emphasized that the descriptions provided herein are not intended to encompass all of the processing steps that may be required to form a functional semiconductor integrated circuit device. Rather, certain processing steps that are commonly used in forming semiconductor devices, such as, for example, wet cleaning and annealing steps, are purposefully not described herein for economy of description.

Moreover, the same or similar reference numbers are used throughout the drawings to denote the same or similar features, elements, or structures, and thus, a detailed explanation of the same or similar features, elements, or structures will not be repeated for each of the drawings. It is to be understood that the terms "about" or "substantially" as used herein with regard to thicknesses, widths, percentages, ranges, etc., are meant to denote being close or approximate to, but not exactly. For example, the term "about" or "substantially" as used herein implies that a small margin of error is present, such as 1% or less than the stated amount.

FIGS. 1 through 5 schematically illustrate an EUV lithographic patterning method which implements a surface hardened EUV resist mask to pattern features in multiple layers, according to an embodiment of the invention. To being, FIG. 1 is a schematic cross-sectional side view of a semiconductor device 100 at an intermediate stage of fabrication, which a substrate 110, an insulating layer 120, a sacrificial hard mask layer 130 (e.g., sacrificial nitride layer), a etch mask 140, an organic planarizing layer (OPL) 150, a hard mask layer 160, and a layer of EUV resist material 170 formed on the hard mask layer 160. In one embodiment, the hard mask layer 160 comprises an anti-reflection coating (ARC) layer formed of amorphous silicon (e.g., a Si-ARC layer).

While the substrate 110 is generically depicted in FIG. 1, in one embodiment, the substrate 110 would comprises various layers including, for example, a base semiconductor substrate (e.g., semiconductor wafer), and an FEOL/MOL stack comprising integrated circuitry and interconnect layers/structures that are formed on the base semiconductor substrate prior to forming the insulating layer 120. In one embodiment, the base semiconductor substrate may be a bulk semiconductor substrate formed of, e.g., silicon, or other types of semiconductor substrate materials that are commonly used in bulk semiconductor fabrication processes such as germanium, silicon-germanium alloy, silicon carbide, silicon-germanium carbide alloy, or compound semiconductor materials (e.g. III-V). Non-limiting examples of compound semiconductor materials include gallium arsenide, indium arsenide, and indium phosphide. In another embodiment, the base semiconductor substrate may be a SOI (silicon on insulator) substrate, which comprises an insulating layer (e.g., oxide layer) disposed between a base substrate layer (e.g., silicon substrate) and an active semiconductor layer (e.g., active silicon layer) in which active circuit components (e.g., field effect transistors) are formed as part of the FEOL layer.

The FEOL layer comprises various semiconductor devices and components that are formed in or on the active surface of the semiconductor substrate to provide integrated circuitry for a target application. For example, the FEOL layer comprises FET devices (such as FinFET devices, planar MOSFET devices, etc.), bipolar transistors, diodes, capacitors, inductors, resistors, isolation devices, etc., which are formed in or on the active surface of the semiconductor substrate. The MOL layer comprises one or more PMD (pre-metal dielectric) layers and conductive contacts (e.g., via contacts) that are formed in the PMD layer. The PMD layer is formed over the components and devices of the FEOL layer. A pattern of openings is formed in the PMD layer, and the openings are filled with a conductive material, such as tungsten, to form conductive via contacts that are in electrical contact with device terminals (e.g., source/drain regions, gate contacts, etc.) of the integrated circuitry of the FEOL layer. The conductive via contacts of the MOL layer provide electrical connections between the integrated circuitry of the FEOL layer and a first level of metallization of a BEOL structure. As is known in the art, a BEOL structure comprises multiple levels of dielectric material and levels of metallization embedded in the dielectric material. The BEOL metallization comprises horizontal wiring, interconnects, pads, etc., as well as vertical wiring in the form of conductive vias that form connections between different interconnect levels of the BEOL structure. A BEOL fabrication process involves successive depositing and patterning of multiple layers of dielectric and metallic material to form a network of electrical connections between the FEOL devices and to provide I/O connections to external components.

In the exemplary embodiment of FIG. 1, the insulating layer 120 generically represents an interlevel dielectric layer (ILD layer) that forms a given interconnect level of a BEOL layer, and which is to be patterned using methods as discussed below to form a pattern of openings (e.g., trenches or vias) in the insulating layer 120, which are to be filled with metallic materials such as copper to form wiring and vertical via structures, etc. The insulating layer 120 can be formed using any suitable dielectric material including, but not limited to, silicon oxide (e.g. SiO2), SiN (e.g., ($Si_3N_4$), hydrogenated silicon carbon oxide (SiCOH), silicon based low-k dielectrics, porous dielectrics, or other known ULK (ultra-low-k) dielectric materials. The insulating layer 120 can be deposited using known deposition techniques, such as, for example, ALD (atomic layer deposition), CVD (chemical vapor deposition) PECVD (plasma-enhanced CVD), or PVD (physical vapor deposition). The thickness of the insulating layer 120 will vary depending on the application, and may have a thickness in a range of about 30 nm to about 800 nm, for example.

The sacrificial hard mask layer 130 may comprise a sacrificial nitride layer which facilitates adhesion between the material of the etch mask pattern 140 and the insulating layer 120 and which allows over etching of the material of the etch mask pattern 140 for a wider process window during the later etch-back without damaging the underling insulating layer 120. The etch mask pattern 140 is formed by depositing one or more layers and patterning the layers using EUV lithographic techniques discussed herein, for example, to form the etch mask pattern 140. The etch mask pattern 140 can be utilized in a subsequent process module to etch the underlying insulating layer 120. For example, the etch mask pattern 140 may comprise a first layer of titanium nitride (TiN) and a second layer of oxide material (e.g., Tetraethyl orthosilicate (TEOS)). The OPL 150 is formed over the etch mask pattern 140 using known organic materials and techniques For example, the OPL 150 may comprise a resin material that is applied by spin coating and baked to enhance planarization. The OPL 150 may comprise a liquid monomer that is applied by spin coating and photochemically hardened. In some embodiments, the OPL 150 is formed to a thickness of approximately 60 nm, although these and other dimensions are presented herein as illustrative examples and should not be construed as limiting.

The hard mask layer 160 is formed over the OPL 150. The hard masker layer 160 serves as an ARC (anti reflection coating) layer. The hard mask layer 160 may be formed of silicon-based materials such as silicon oxide, silicon nitride or silicon oxynitride, although a wide variety of other inorganic or organic materials could be used. Additional examples of inorganic materials that may be used to form the hard mask layer 160 include metal-containing materials such as titanium oxide or titanium nitride. Numerous other metal oxides, metal nitrides and/or metal oxynitrides, as well as other types of metal-containing materials, could be used. The hard mask layer 160 may have a thickness in the range of about 3 nm to about 15 nm.

The layer of EUV resist material 170 is formed over the hard mask layer 160. The layer of EUV resist material 170 comprises a photosensitive material suitable for patterning using an EUV radiation source and a corresponding photomask. The layer of EUV resist material 170 comprises an organic EUV photoresist, and more particularly an organic chemically-amplified photoresist, although other types of resist materials can be used. In one embodiment, the layer of EUV resist material 170 is formed with a thickness T in a range of about 10 nm to about 20 nm.

Figure 2:
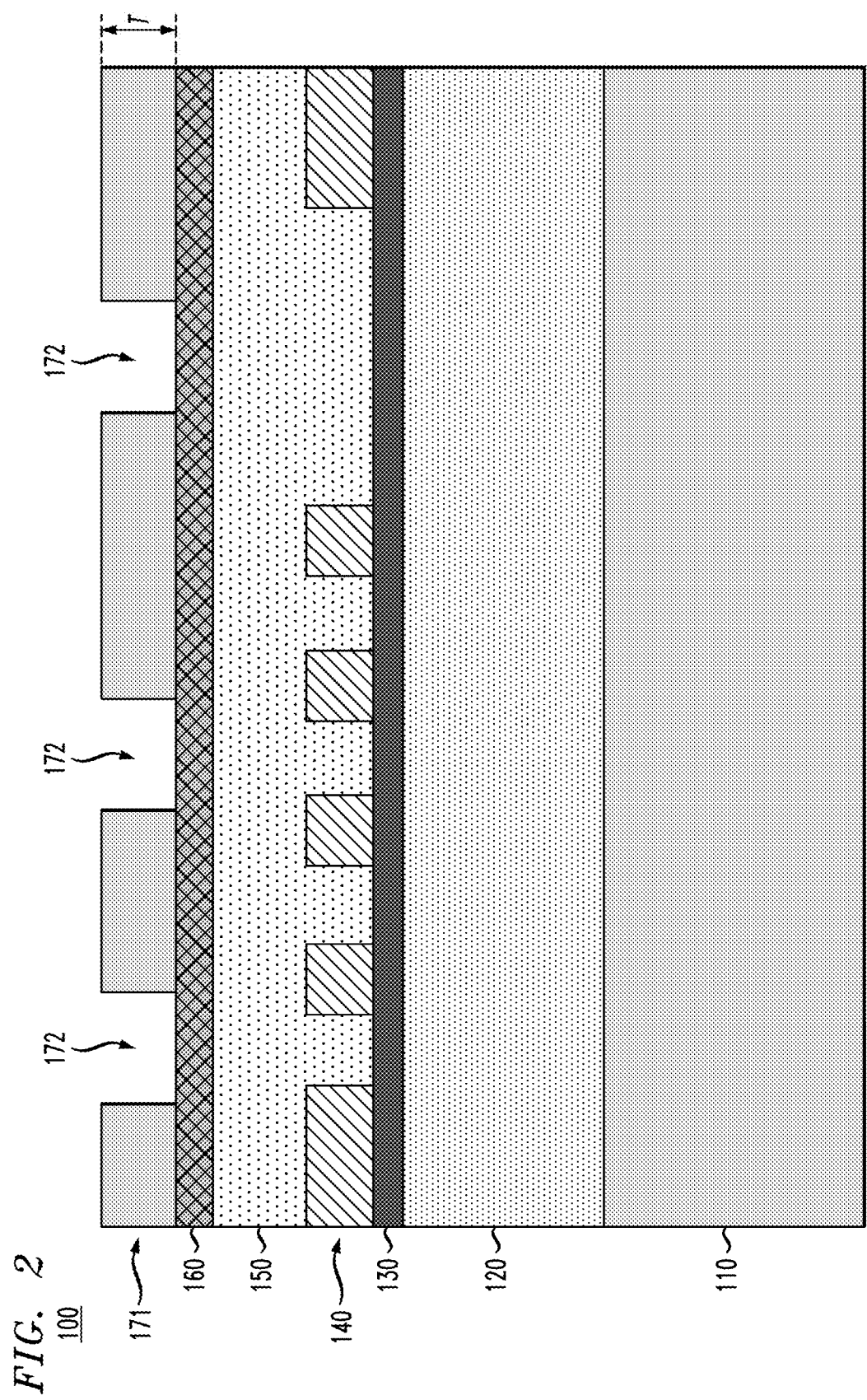

FIG. 2 is schematic cross-sectional side view of the semiconductor device of FIG. 1 after exposing and developing the layer of EUV resist material 170 to form an EUV resist mask 171. The layer of EUV resist material 170 can be exposed and developed using techniques known to those of ordinary skill in the art, the details of which are not necessary for understanding the methods discussed herein.

Briefly, the layer of EUV resist material 170 is exposed to an EUV radiation source through an image pattern using an EUV lithography tool, and the exposed layer of EUV resist material 170 is developed in a developing solvent to form the EUV resist mask 171 by removing the irradiated regions of the layer of EUV resist material 170 (as in the case of positive photo-resist), or non-irradiated regions of the layer of EUV resist material 170 (as in the case of negative resist) using a developing solvent. The resulting EUV resist mask 171 comprises a plurality of openings 172 that define images of openings to be transferred into underlying hard mask layer 160 and the OPL 150. For illustrative purposes, it is assumed that the EUV resist mask 171 comprises a same or similar thickness T as the layer of EUV resist material 170 prior to exposure and development.

Figure 3:
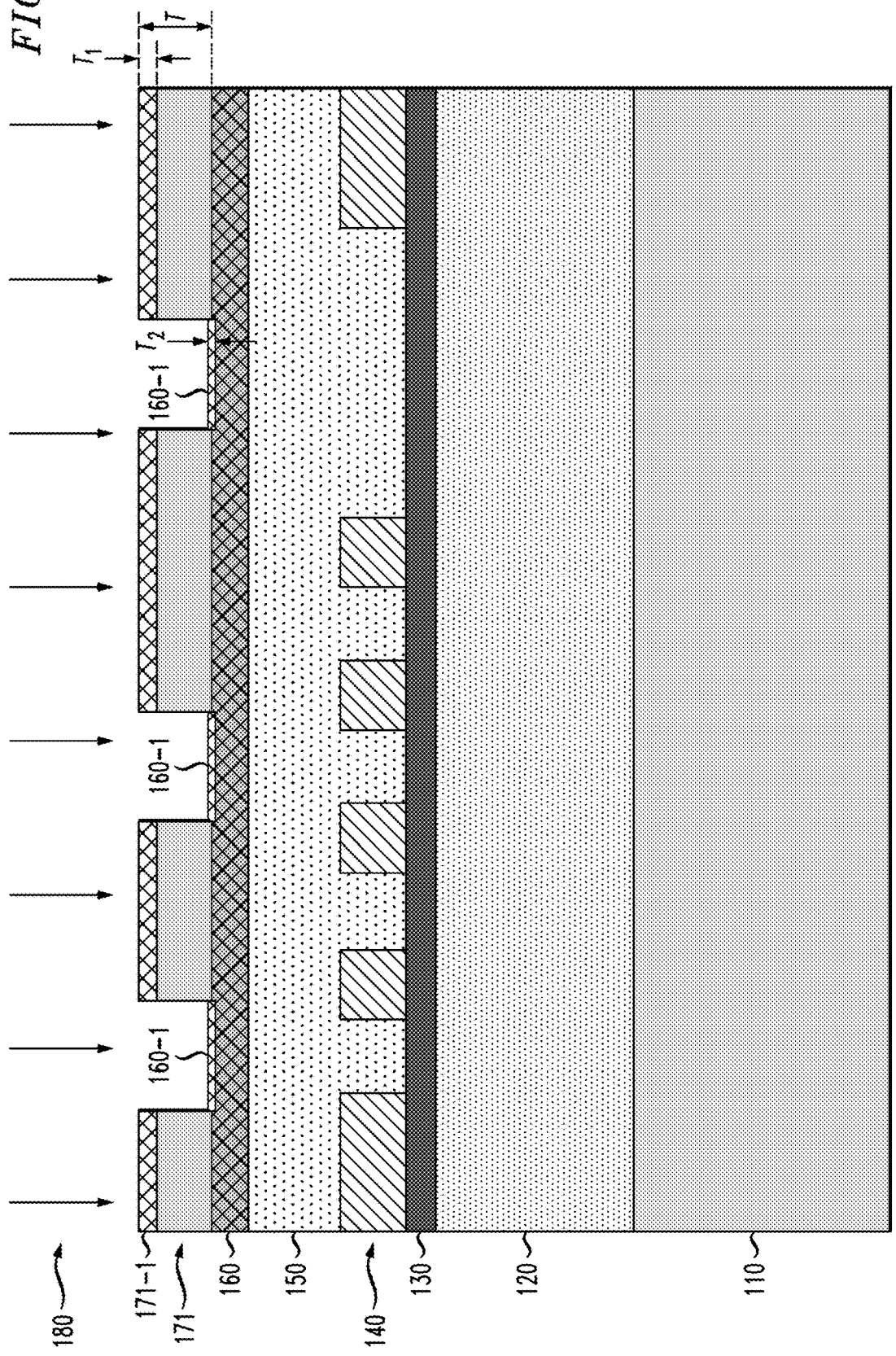

Next, FIG. 3 is a schematic cross-sectional side view of the semiconductor device of FIG. 2, which shows a controlled surface treatment 180 being applied to harden a surface of the EUV resist mask 171. The controlled surface treatment 180 is applied to the upper surface of the EUV resist mask 171 to form thin, embedded etch-resistant layer 171-1 (or surface-hardened layer) in the upper surface of EUV resist mask 171. As shown in FIG. 3, at the completion of the controlled surface treatment 180, the embedded etch-resistant layer 171-1 has a thickness $T_1$, while the surface-hardened EUV resist mask 171 comprises the same or similar thickness T prior to the controlled surface treatment. In one embodiment, the thickness $T_1$ of the embedded etch-resistant layer 171-1 is in a range of about 3 nm or less. The controlled surface treatment 180 of FIG. 3 can be implemented using various methods.

For example, the controlled surface treatment 180 can be implemented using a gas cluster ion beam (GCIB) process, or a neutral atom beam (NAB) technique (or accelerated NAB). In general, these surface treatment techniques involve a bombardment process in which the surface of the EUV resist mask 171 is bombarded with high energy particles to implant a metallic or chemical species into the surface of the EUV resist mask 171 to form the etch-resistant layer 171-1. For example, the implanted species comprises a chemical species including, but not limited to, argon (Ar), boron (B), silicon (Si), and flourine (F) atoms. In another embodiment, the implanted species may comprises a metallic species including, but not limited to, platinum (Pt), ruthenium (Ru), titanium (Ti), and tantalum (Ta). The etch resistance layer 171-1 with the implanted chemical or metallic species serves to retard the etching of the surface of the EUV resist mask 171 (in a subsequent RIE) by reducing volatilization. The etch resistance layer 171-1 provides etch resistance due to chemical alteration (e.g., Si-rich layer) and/or structural alteration (e.g., amorphization) of the upper surface of the EUV layer 171 to a depth of 1 to 100 angstroms or more.

The GCIB and NAB treatment methods are technologies that enable nano-scale modification of surfaces, e.g., chemically alter surfaces through infusion. With GCIB, the surface of the EUV resist mask 171 is bombarded by a beam of high energy nanoscale cluster ions, which are formed when a high pressure gas (e.g., 10 atmospheres pressure) expands into a vacuum. In one example embodiment, a GCIB treatment can be implemented with a suitable mixture of gases (which comprises a target implant species) and an energy in a range of about 10 keV to about 30 keV to chemically alter the surface of the EUV resist mask 171 through infusion at a controlled penetration depth of less than about 10 nm. Similarly, a NAB surface treatment enables ultra-shallow processing of surfaces by converting energized gas cluster ions produced by a GCIB method into intense collimated beams of coincident neutral gas atoms having controllable average energies from about 10 eV per atom to about 100 eV per atom. An electrostatic deflector is used to eliminate charged species in the environment, while allowing the released neutral atoms to bombard the target surface and produce effects similar to those normally associated with GCIB, but to shallower depths (e.g., about 3 nm or less).

As further shown in FIG. 3, the controlled surface treatment 180 results in the formation of modified surfaces 160-1 in portions of the underlying hard mask layer 160 which are exposed through the openings 172 of the EUV resist mask 171. While these modified surfaces 160-1 are not desirable and may provide etch resistance to the hard mask layer 160, it is to be appreciated that the modified surfaces 160-1 have a thickness $T_2$ which is less than the thickness $T_1$ of the upper embedded etch-resistant layer 171-1 of the EUV resist mask 171. This difference in thickness is due to geometric constraints from the aspect ratio of the openings 172 in the EUV resist mask 171, which impedes the amount and/or depth of the species implantation into the exposed surfaces of the hard mask layer 160 at the bottom of the mask openings 172, while the upper surface of the EUV resist mask 171 is subjected to a greater amount and/or depth of the species implantation during the controlled surface treatment 180. Moreover, the parameters of the controlled surface treatment 180 (e.g., implant species, landing energies, etc.) can be tuned or otherwise optimized to increase the selectivity of the species implantation into the surface of the EUV resist mask 171 as compared to the exposed surfaces of the hard mask layer 160.

Figure 4:
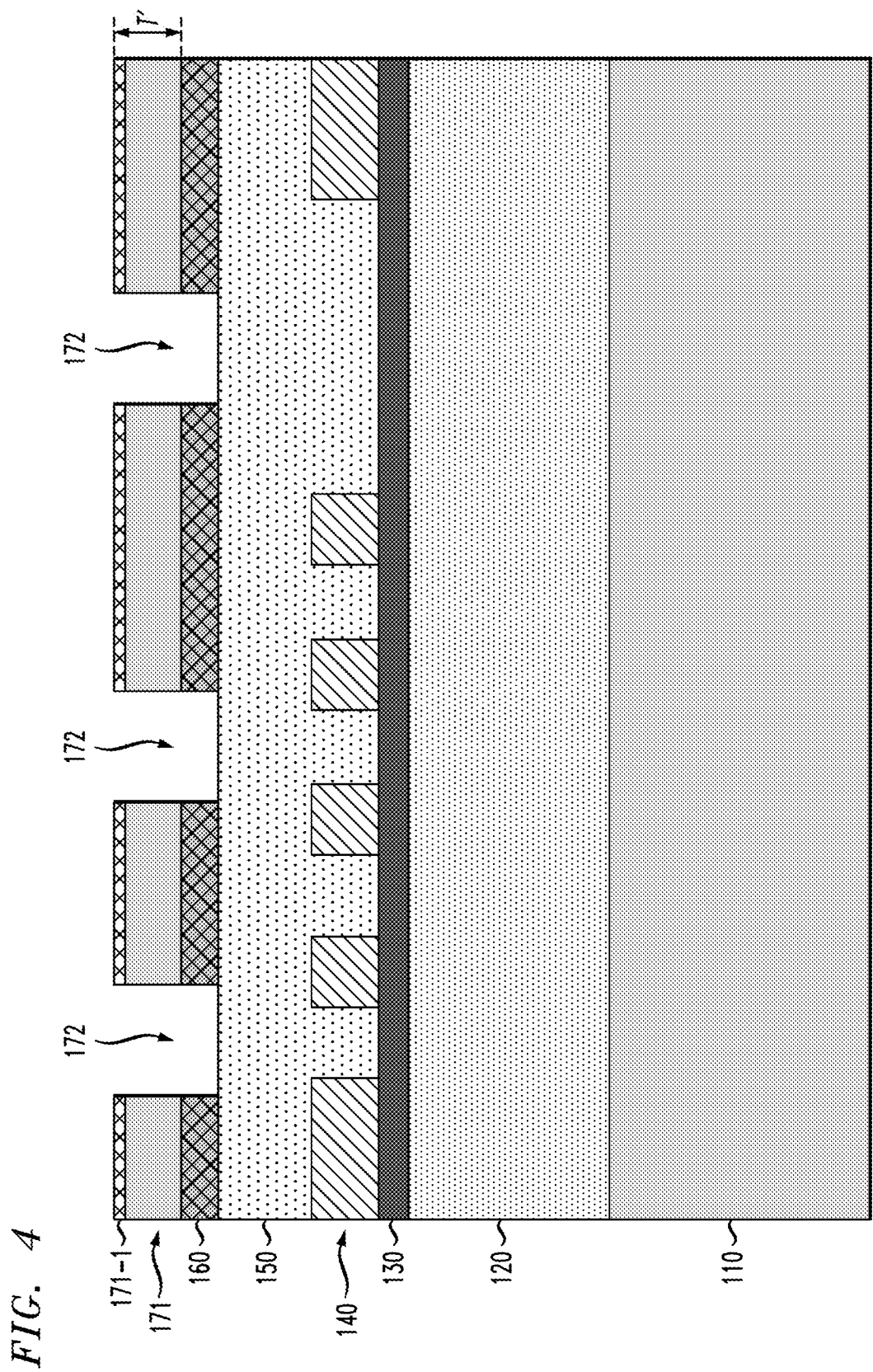

Following the control surface treatment, FIG. 4 is a schematic cross-sectional side view of the semiconductor device of FIG. 3, after patterning the underlying hard mask layer 160 using the surface-hardened EUV resist mask 171. In one embodiment of the invention, the hard mask layer 160 is patterned using an anisotropic dry etch process (such as RIE). With this etch process, the exposed modified surfaces 160-1 and the underlying portions of the hard mask layer 160 can be etched down to the OPL 150 without breakthrough of the etch-resistant layer 171-1 of the EUV resist mask 171. For example, as shown in FIG. 4, while some of the etch-resistant layer 171-1 may be removed during the patterning of the hard mask layer 160, the overall remaining (reduced) thickness T' of the EUV resist mask 171 is slightly less than the thickness T of the EUV resist mask 171 prior to the etch process. In this regard, the thicker etch-resistant layer 171-1 enables "punch-through" of the surface-treated hard mask layer 160 while preventing any significant reduction in the thickness of the remaining EUV resist mask 171.

Figure 5:
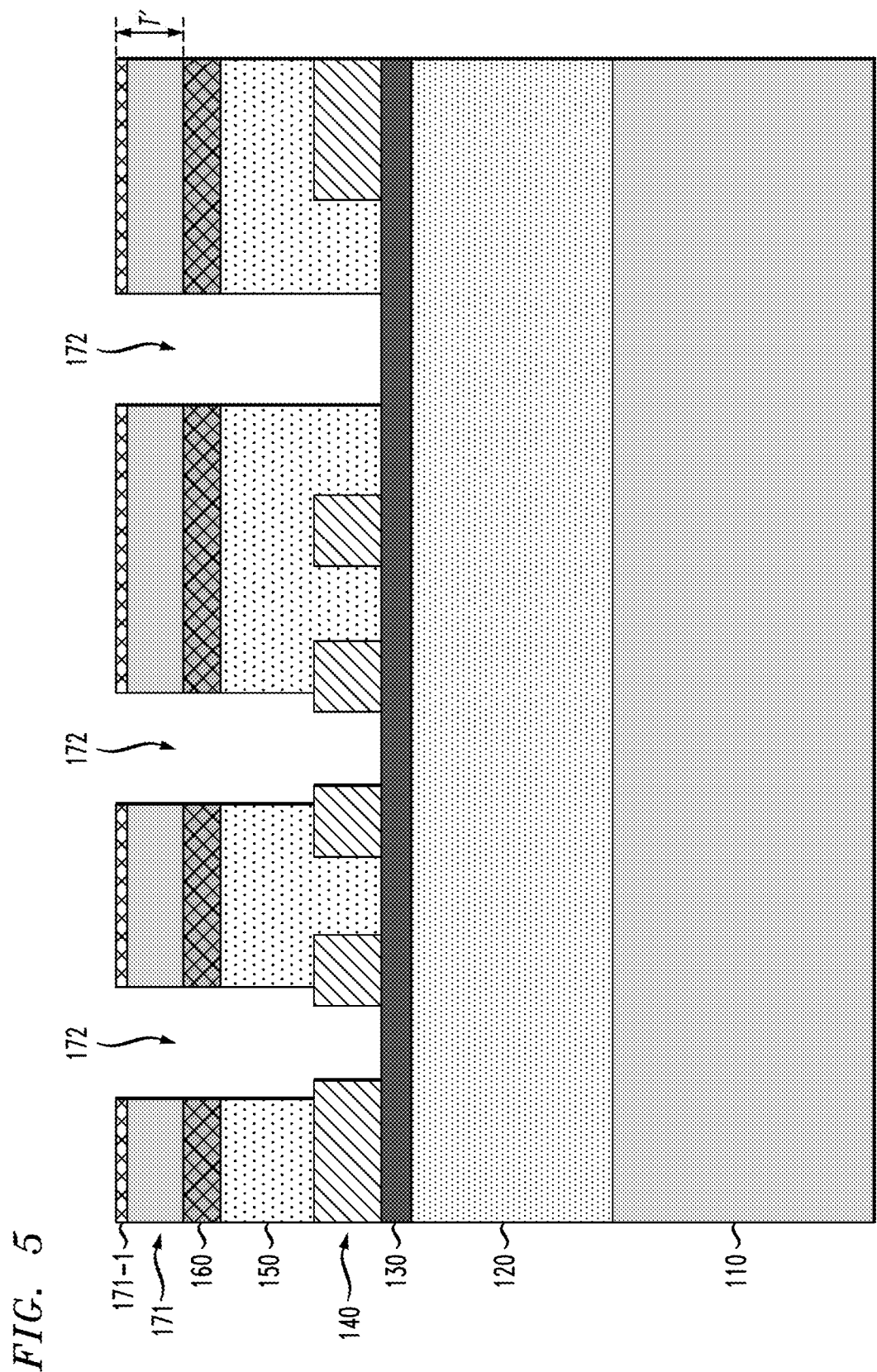

Next, FIG. 5 is a schematic cross-sectional side view of the semiconductor device of FIG. 4, after patterning the underlying OPL 150 using the surface-hardened EUV resist mask 171. The etch process results in transferring the image of the openings 172 of the surface-hardened EUV resist mask 171 into the OPL 150. The OPL 150 can be etched using a dry etch process having an etch chemistry which is configured to etch the material of the OPL 150 selective to the materials of the etch mask layer 140 and the sacrificial hard mask layer 130.

Following the patterning of the OPL 150, another dry etch process is performed to etch the sacrificial hard mask layer 130 to transfer the image of the openings 172 into the sacrificial hard mask layer 130. The etching of the OPL 150 and the sacrificial hard mask layer 130 can be performed without breakthrough of the etch-resistant layer 171-1 of the surface-hardened EUV resist mask 171. Even if breakthrough of the etch-resistant layer 171-1 does occur at some point during the etching of the OPL 150 or the sacrificial hard mask layer 130, the etching will result in a small reduction in the thickness of the remaining EUV resist mask 171, but not completely removing the EUV resist mask 171.

Following the patterning of the sacrificial hard mask layer 130, the remaining EUV resist mask 171, hard mask layer 160, and OPL 150 can be removed. Thereafter, the insulating layer 120 can be patterned using the patterned sacrificial hard mask layer 130 as an etch mask to form via openings in the insulating layer 120.

Figure 6:
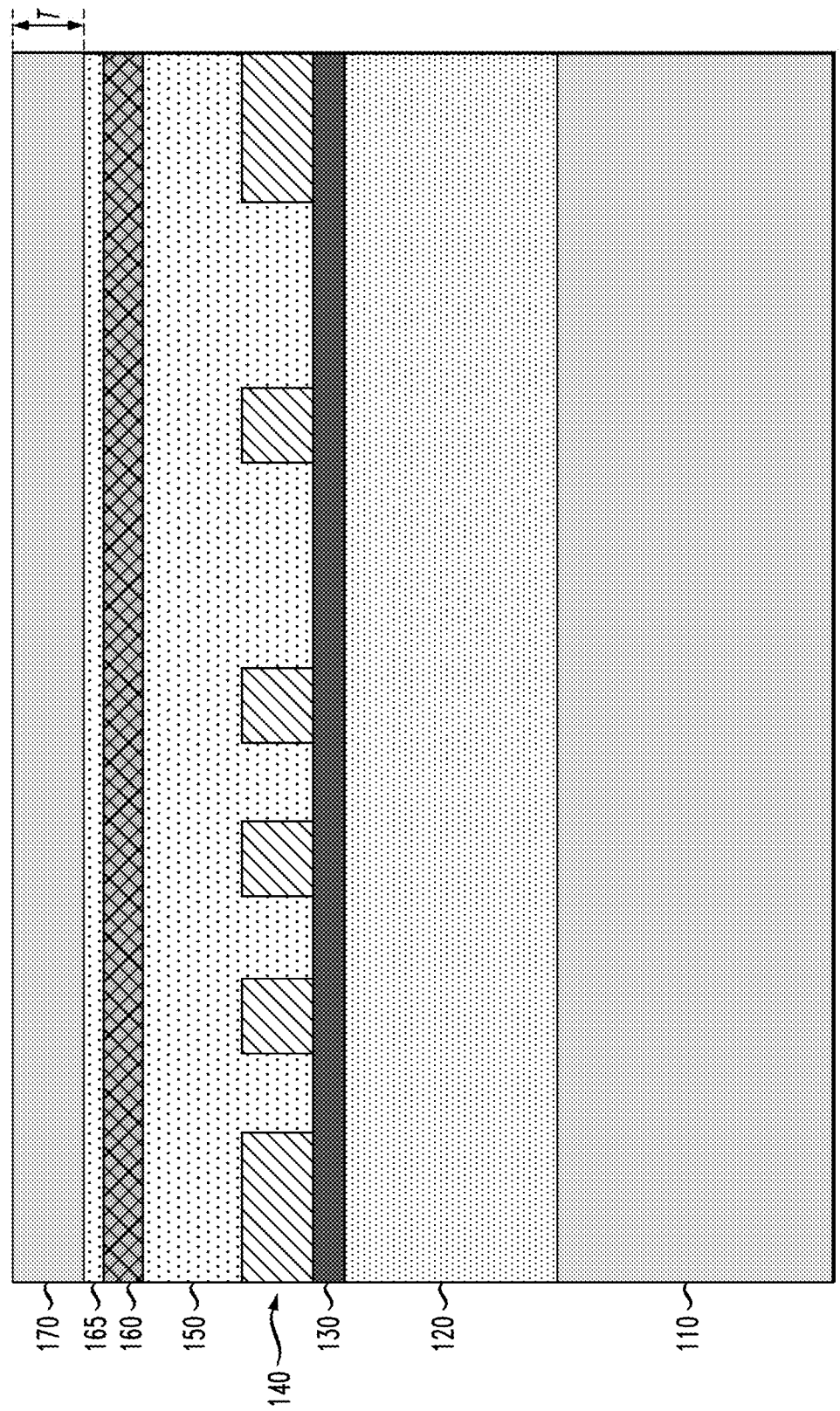
Figure 7:
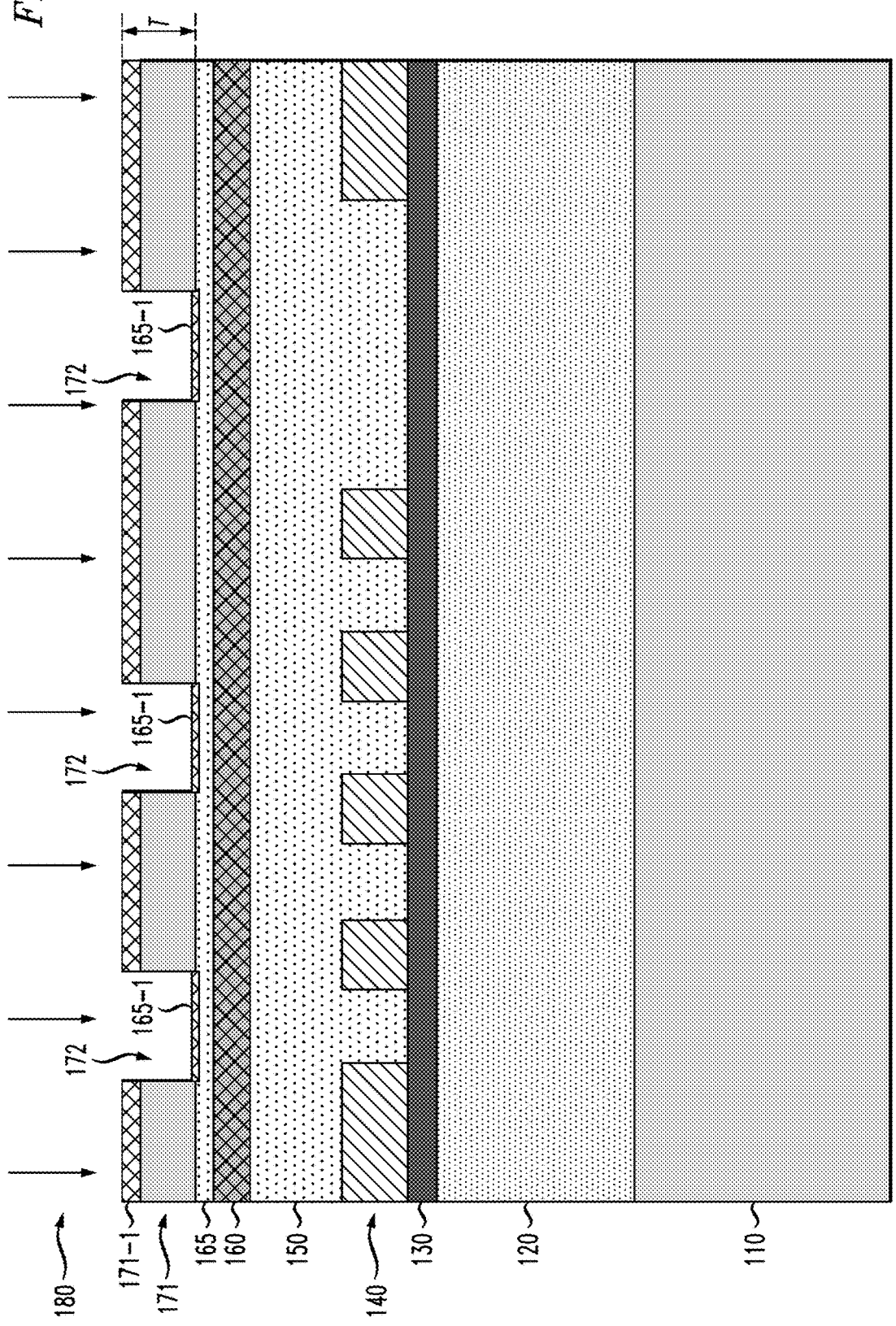

FIGS. 6 and 7 schematically illustrate an EUV lithographic patterning method which implements a surface hardened EUV resist mask to pattern features in multiple layers, according to another embodiment of the invention. The patterning method of FIGS. 6 and 7 is similar to the patterning method discussed above with reference to FIGS. 1-5, except for the inclusion of an adhesion layer between the EUV layer and the hard mask layer. In particular, FIG. 6 is a schematic cross-sectional side view of a semiconductor device 200 at an intermediate stage of fabrication, which comprises a layer of EUV resist material 170 formed on an adhesion layer 165, which is formed on the hard mask layer 160. The adhesion layer 165 comprises a material that serves to enhance adhesion between the layer of EUV resist material 170 and the hard mask layer 160. In one embodiment, the adhesion layer 165 comprises an organic material. Except for the adhesion layer 165, the intermediate structure shown in FIG. 6 is the same as the intermediate structure shown in FIG. 1.

FIG. 7 is a schematic cross-sectional side view of the semiconductor device of FIG. 6 after exposing and developing the layer of EUV resist material 170 to form the EUV resist mask 171, and after applying the controlled surface treatment 180 to harden the surface of the EUV resist mask 171. The intermediate structure shown in FIG. 7 is the same as the intermediate structure shown in FIG. 3, except that in FIG. 7, the controlled surface treatment 180 results in the formation of modified surfaces 165-1 in portions of the underlying adhesion layer 165 which are exposed through the openings 172 of the EUV resist mask 171. A sequential etch process (similar to that discussed above with reference to FIGS. 4 and 5) is then performed to transfer the image of the openings 172 into the exposed portions of the adhesion layer 165, the hard mask layer 160, the OPL 150, and the sacrificial hard mask layer 130. With this sequential etch process, the exposed modified surfaces 165-1 and the underlying portions of the adhesion layer 165, and the hard mask layer 160 can be etched down to the OPL 150 without breakthrough of the etch-resistant layer 171-1 of the EUV resist mask 171.

It is to be understood that the patterning methods discussed herein can be incorporated within semiconductor processing flows for fabricating various types of semiconductor devices and integrated circuits having analog and digital circuitry or mixed-signal circuitry. In particular, integrated circuit dies can be fabricated with various devices such as field-effect transistors, bipolar transistors, metal-oxide-semiconductor transistors, diodes, capacitors, inductors, etc. An integrated circuit in accordance with the present invention can be employed in applications, hardware, and/or electronic systems. Suitable hardware and systems for implementing the invention may include, but are not limited to, personal computers, communication networks, electronic commerce systems, portable communications devices (e.g., cell phones), solid-state media storage devices, functional circuitry, etc. Systems and hardware incorporating such integrated circuits are considered part of the embodiments described herein. Given the teachings of the invention provided herein, one of ordinary skill in the art will be able to contemplate other implementations and applications of the techniques of the invention.

Although exemplary embodiments have been described herein with reference to the accompanying figures, it is to be understood that the invention is not limited to those precise embodiments, and that various other changes and modifications may be made therein by one skilled in the art without departing from the scope of the appended claims.

We claim:

1. A device, comprising:
   a substrate;
   an extreme ultraviolet (EUV) resist mask disposed on the substrate, wherein the EUV resist mask comprises patterned openings which expose portions of an upper surface of an underlying layer of the substrate;
   an etch-resistant layer embedded in upper horizontal surfaces of the EUV resist mask, wherein the etch-resistant layer is formed by a controlled surface treatment that is configured to implant a species into upper horizontal surfaces of the EUV resist mask and not on vertical sidewall surfaces of the patterned openings of the EUV mask, and thereby form the etch-resistant layer that is embedded in only the upper horizontal surfaces of the EUV resist mask, wherein the etch-resistant layer comprises a first thickness; and
   a hardened layer embedded in the exposed portions of the upper surface of the underlying layer of the substrate, wherein the hardened layer is formed as a result of implanting the species into the exposed portions of the upper surface of the underlying layer of the substrate, wherein the hardened layer has a second thickness which is less than the first thickness;
   wherein a difference in the thicknesses of the etch-resistant layer and the hardened layer is configured to enable patterning of the underlying layer of the substrate using the surface-hardened EUV resist mask and using an anisotropic dry etch process to punch-through the hardened layer in the exposed portions of the upper surface of the underlying layer of the substrate and etch away remaining exposed portions of the underlying layer of the substrate without completely removing the etch-resistant layer in the upper horizontal surfaces of the EUV resist mask.

2. The device of claim 1, wherein the implanted species comprises a chemical species.

3. The device of claim 2, wherein the chemical species comprises one of argon (Ar), boron (B), silicon (Si), and fluorine (F) atoms.

4. The device of claim 1, wherein the implanted species comprises a metallic species.

5. The device of claim 4, wherein the metallic species comprises one of platinum (Pt), ruthenium (Ru), titanium (Ti), and tantalum (Ta).

6. The device of claim 1, wherein the implanted species is implanted into the upper surface of the EUV resist mask using a neutral atom beam (NAB) process.

7. The device of claim 1, wherein the EUV resist mask has a thickness which is no greater than about 20 nm.

8. The device of claim 1, wherein the etch-resistant layer has a thickness which is no greater than about 3 nm.

9. The device of claim 1, wherein the underlying layer of the substrate comprises a hardmask layer.

10. A device, comprising:
    a multi-layer lithographic stack disposed on a substrate, wherein the multi-layer lithographic stack comprises an extreme ultraviolet (EUV) resist mask, and wherein the EUV resist mask comprises patterned openings which expose portions of an upper surface of an underlying layer of the multi-layer lithographic stack;
    an etch-resistant layer embedded in upper horizontal surfaces of the EUV resist mask, wherein the etch-resistant layer is formed by a controlled surface treatment that is configured to implant a species into upper horizontal surfaces of the EUV resist mask and not on vertical sidewall surfaces of the patterned openings of the EUV mask, and thereby form the etch-resistant layer that is embedded in only the upper horizontal surfaces of the EUV resist mask, wherein the etch-resistant layer comprises a first thickness; and
    a hardened layer embedded in the exposed portions of the upper surface of the underlying layer of the multi-layer lithographic stack, wherein the hardened layer is formed as a result of implanting the species into the exposed portions of the upper surface of the underlying layer of the multi-layer lithographic stack, wherein the hardened layer has a second thickness which is less than the first thickness;
    wherein a difference in the thicknesses of the etch-resistant layer and the hardened layer is configured to enable patterning of the underlying layer of the multi-layer lithographic stack using the surface-hardened EUV resist mask and using an anisotropic dry etch process to punch-through the hardened layer in the exposed portions of the upper surface of the underlying layer of the multi-layer lithographic stack and etch away remaining exposed portions of the underlying layer of the multi-layer lithographic stack without completely removing the etch-resistant layer in the upper horizontal surfaces of the EUV resist mask.

11. The device of claim 10, wherein the EUV resist mask has a thickness which is no greater than about 20 nm, and wherein the etch-resistant layer has a thickness which is no greater than about 3 nm.

12. The device of claim 10, wherein the multi-layer lithographic stack further comprises:
    a hard mask antireflection coating layer; and
    an organic planarizing layer,
    wherein the hard mask antireflection coating layer is disposed between the layer of EUV resist mask and the organic planarizing layer.

13. The device of claim 10, wherein the multi-layer lithographic stack further comprises:
    an adhesion layer;
    a hard mask antireflection coating layer; and
    an organic planarizing layer;
    wherein the adhesion layer is disposed between the layer of EUV resist material and the hard mask antireflection coating layer;
    wherein the hard mask antireflection coating layer is disposed on the organic planarizing layer; and
    wherein the adhesion layer comprises the hardened layer embedded in the exposed portions of the upper surface of the adhesion layer.

14. The device of claim 10, wherein the implanted species comprises a chemical species, wherein the chemical species comprises one of argon (Ar), boron (B), silicon (Si), and fluorine (F) atoms.

15. The device of claim 10, wherein the implanted species comprises a metallic species, wherein the metallic species comprises one of platinum (Pt), ruthenium (Ru), titanium (Ti), and tantalum (Ta).

16. The device of claim 10, wherein the EUV resist mask has a thickness which is no greater than about 20 nm.

17. The device of claim 10, wherein the etch-resistant layer has a thickness which is no greater than about 3 nm.

18. The device of claim 10, wherein the implanted species is implanted into the upper surface of the EUV resist mask using a neutral atom beam (NAB) process.

* * * * *